United States Patent

Huang

Patent Number: 5,811,376
Date of Patent: Sep. 22, 1998

[54] METHOD FOR MAKING SUPERCONDUCTING FIBERS

[75] Inventor: Jianzhong Huang, Westerville, Ohio

[73] Assignee: Owens Corning Fiberglas Technology Inc., Summit, Ill.

[21] Appl. No.: 570,953

[22] Filed: Dec. 12, 1995

[51] Int. Cl.$^6$ .................................................. H01L 39/24
[52] U.S. Cl. ........................ 505/430; 505/450; 505/230; 505/704; 505/740; 505/822; 427/62; 65/430; 65/444; 264/173.16; 264/211.11
[58] Field of Search ...................................... 505/430, 450, 505/230, 704, 740, 822; 427/62; 65/430, 444; 174/125.1; 29/599; 264/173.16, 211.11

[56] References Cited

U.S. PATENT DOCUMENTS

| | | |
|---|---|---|
| 4,968,662 | 11/1990 | Urano . |
| 5,006,671 | 4/1991 | Boeke . |
| 5,017,552 | 5/1991 | Porcell . |
| 5,037,800 | 8/1991 | Iijima . |
| 5,045,526 | 9/1991 | Nagesh . |
| 5,093,311 | 3/1992 | Shiota . |
| 5,126,321 | 6/1992 | Hinks . |
| 5,196,399 | 3/1993 | Shiota . |
| 5,204,315 | 4/1993 | Ito . |
| 5,215,565 | 6/1993 | Urano . |
| 5,248,656 | 9/1993 | Nagesh et al. .............................. 505/1 |

OTHER PUBLICATIONS

Huang, Jianzhong; Novel Processing Of High–Tc Ceramic Superconducting Fibers Midwest Superconductor Consortium, Jul. 1993, pp. 2–8.

*Primary Examiner*—Roy V. King
*Attorney, Agent, or Firm*—C. Michael Gegenheimer; Inger H. Eckert

[57] ABSTRACT

A process for making a superconducting fiber or wire (10) is provided. The superconducting fiber or wire (10) has a superconducting core (12) and a glass cladding outer layer (14). The process comprises melting a superconducting composition (16) and a glass composition (18) and simultaneously drawing the compositions from a bushing (26) with the glass cladding layer (14) surrounding the superconducting core (12). The wire (10) is then annealed to create a superconducting crystalline phase.

20 Claims, 4 Drawing Sheets

METHOD FOR MAKING SUPERCONDUCTING FIBERS

TECHNICAL FIELD

This invention relates to a method for making superconducting fibers, and more particularly, to a method for making superconducting fibers with a glass cladding layer.

BACKGROUND ART

The discoveries of high $T_c$ superconducting compositions which exhibit superconducting properties when cooled by relatively inexpensive liquid nitrogen have generated wide interest because of the potential of manufacturing devices which are much more efficient in their use of energy. However, while the potential remains, many problems exist in providing commercially applicable products which use such superconductors. One problem area is in the production of superconducting wires. An inherent problem is that ceramic superconducting compositions are brittle and fragile and cannot be easily formed into desired shapes. Another problem is that the superconducting compositions must be of sufficient density to carry a desired electrical current.

Although wire-shaped superconductors have been reported, the wires have been relatively short in length, have had poor current-carrying capabilities, and have lacked mechanical strength and flexibility. Ceramic superconductors are inherently brittle. Also, the viscosity of superconducting material in the molten state is very low, on the order of 1 poise. Thus, they lack the necessary strength and viscosity for suitable fiber formation.

One type of superconducting wire has been produced by the so called "powder-in-tube" technique. In this method, preformed hollow metal tubes are filled with heat-treated superconducting powders and then cold worked down to a desired diameter. After cold working, the wire is then heated to sinter the superconducting powder. However, a major drawback to this technique is that the density of the superconducting composition is low, resulting in a porous mass which has a low electrical current carrying capacity (i.e., $10^4$ amp/cm$^2$ or less).

In another prior art method, the superconducting material, in powder form, is mixed with an organic binder and extruded to form a thin wire shape. It is then fired to burn off the binder and sintered to turn the powder into a current carrying wire. However, once the organic binder is burned out, the wire becomes quite fragile and brittle.

Other attempts have been made to produce superconducting wires. Urano et al, U.S. Pat. Nos. 4,968,662 and 5,215,565, teach a method for producing superconducting wires by filling a pre-formed closed end glass tube with a powdered superconducting material and spinning the tube to form a wire. Boeke, U.S. Pat. No. 5,006,671, discloses forming a glass clad superconducting wire by filling a glass-lined metal cylinder with a powdered superconducting material, drawing the cylinder through progressively smaller dies, and then sintering the powder. Iijima et al, U.S. Pat. No. 5,037,800 teach a method of drawing a molten superconducting oxide encased in a softened glass outer layer through an elongated block to form a superconducting wire. Nagesh et al, U.S. Pat. No. 5,045,526, disclose a method which uses a tubular glass preform which is filled with a superconducting oxide powder, heating the glass to soften it, and then drawing the softened glass and powder into a wire.

Accordingly, the need exists in the art for a process for making a superconducting wire having the requisite density and micro-structure to carry an electrical current while also possessing the flexibility and strength to be used in commercial applications.

DISCLOSURE OF INVENTION

The present invention meets those needs by simultaneously drawing a molten superconducting material and glass cladding layer into a fiber to form a superconducting wire which is flexible and has a high electrical current carrying capacity. In accordance with one aspect of the present invention, a process for making a superconducting fiber having a glass cladding layer is provided and includes the steps of melting a first charge of a metal or ceramic superconducting composition and a second charge of a glass composition, forming a preform by simultaneously drawing the molten charge of the metal or ceramic superconducting composition through an orifice while drawing the molten charge of the glass composition as a cladding layer surrounding the superconducting composition, annealing the preform to crystallize a superconducting phase in the superconducting composition to form a superconducting wire or fiber, and then cooling the glass-clad wire or fiber.

The process may further include the steps of coating the glass cladding layer with a polymer or sizing composition to assist fiber handling and heat treating the preform to promote phase separation of the glass cladding layer and then removing one of the separated phases of the glass. The step of heat treating the preform preferably comprises heating the preform to a temperature of from about 400° to about 650° C. The step of removing one of the separated phases preferably includes chemically etching the glass cladding layer. The step of chemically etching may be an acid leach or a plasma leach.

The step of annealing the preform is preferably conducted at a temperature of from about 700° to about 950° C. The step of annealing may further includes the step of bringing an oxygen containing gas into contact with the superconducting composition. The process may further include the step of coating a metal over the glass cladding layer of the superconducting wire or fiber. The metal may be aluminum or indium metal. The superconducting composition may be a Bi—Sr—Ca—Cu—O ceramic, a Y—Ba—Cu—O ceramic, a Tl—Ba—Ca—Cu—O ceramic or a Hg—Ba—Ca—Cu—O ceramic. The glass composition preferably is an alkali-boron-silicate glass. Lastly, the process of making the superconducting wire or fiber may be conducted continuously.

Accordingly, it is a feature of the present invention to provide a method for manufacturing a superconducting fiber or wire having a glass cladding layer. Other features and advantages of the invention will be apparent from the following description, the accompanying drawings and the appended claims.

BEST MODE FOR CARRYING OUT THE INVENTION

Figure 1:
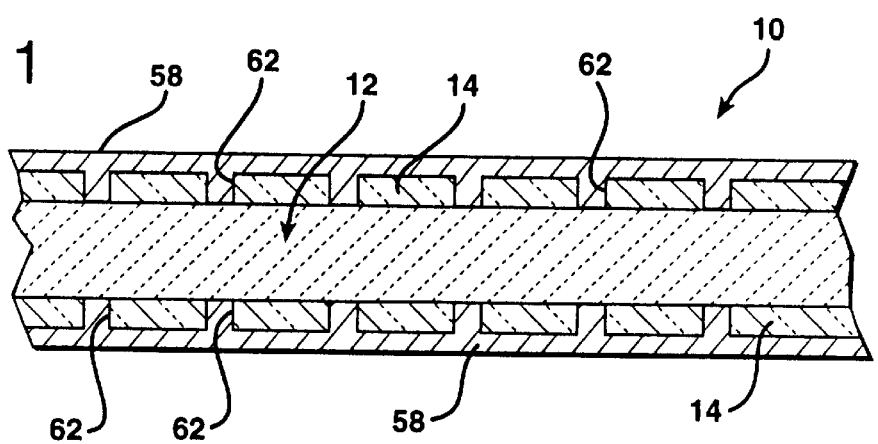
FIG. 1 is a cross-sectional side view of a superconducting wire or fiber accordingly to the present invention.
Figure 2:
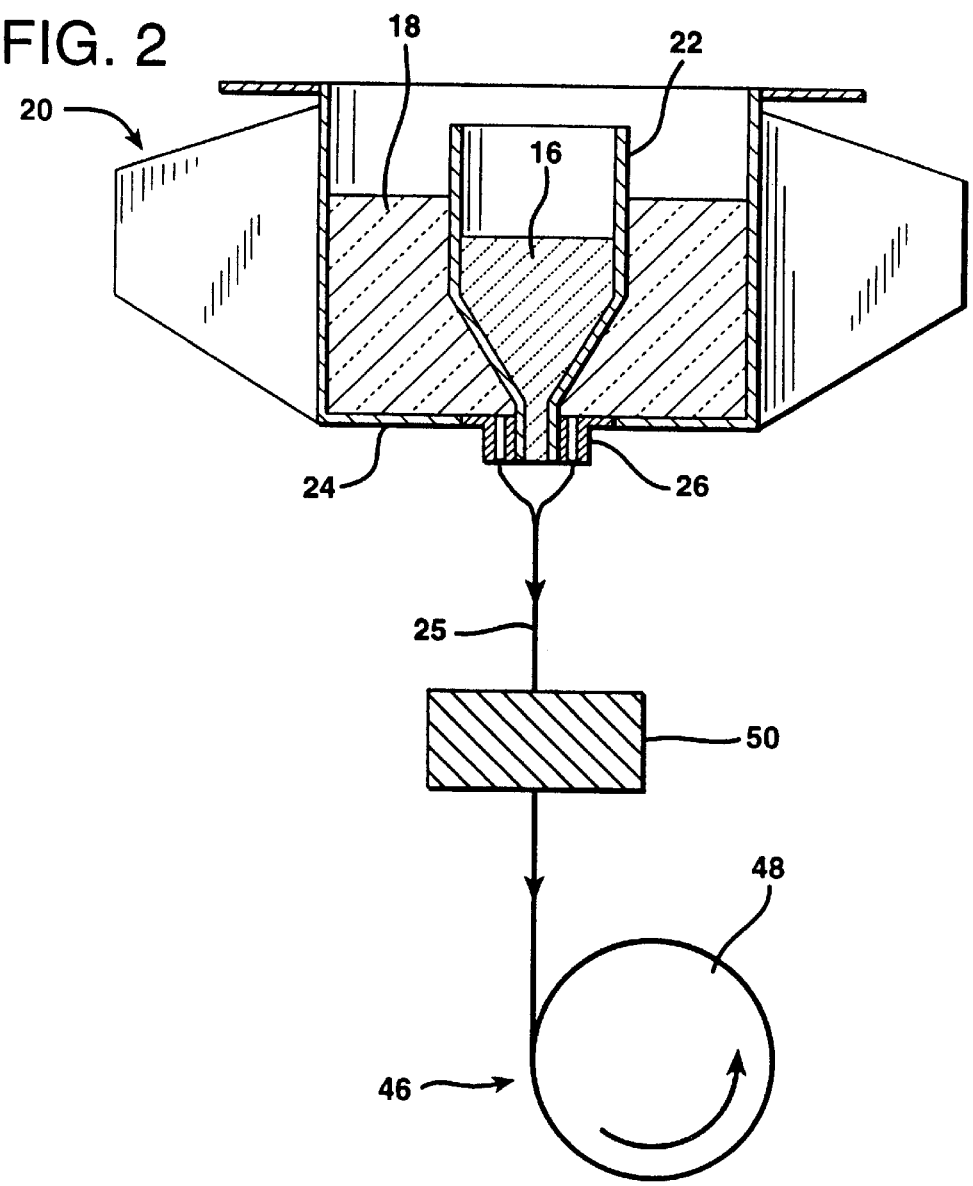
FIG. 2 is a schematic representation of the process of forming a wire preform according to the present invention.

The present invention will be described by reference to the accompanying figures. Turning to FIG. 1, a superconducting wire 10 or fiber is shown. The superconducting wire 10 comprises a core 12 of a superconducting material and an outer glass cladding 14. Typically, the thickness ratio of core 12 to glass cladding 14 ranges from about 1:1 to about 4:1. However, one of ordinary skill in the art will recognize that other ratios are also available. Turning now to FIG. 2, there is seen a schematic representation of the method of the present invention to produce superconducting wire 10. The process comprises melting a metal or ceramic superconducting composition 16 and a glass composition 18 in a double bushing 20. The metal or ceramic superconducting composition 16 can be any composition known in the art which is capable of forming a high temperature superconductor upon heating to form a crystalline superconducting phase.

High temperature superconductors, as intended in this application, are compositions which are superconducting when cooled to below their respective critical temperature ($T_c$), all of which are higher than the temperature of liquid nitrogen or about 77° K. That is, the superconducting composition should be superconducting at about 77° K or higher. Several high temperature superconducting systems are known and all can be employed in the present invention. Known systems include the Y—Ba—Cu—O (YBCO material) system, the Bi—Sr—Ca—Cu—O (BISCCO) system, the TI—Ba—Ca—Cu—O (TBCCO) system and the Hg—Ba—Ca—Cu—O (HBCCO) system. These systems are well known and documented in the prior art.

As the superconducting composition is completely melted in the bushing prior to fiber or wire formation, the present invention may prepare the superconducting composition 16 from readily available raw materials such as oxide and carbonate compounds of the individual components of the superconducting composition. The compositions are then homogenized in the bushing while in the molten state. Prior art processes, on the other hand, require the use of high quality superconducting powder compositions which are very expensive and dramatically increase production costs.

Glass composition 18 may be any glass composition which when melted has suitable properties for fiber drawing. Such compositions generally include those which when melted have a viscosity suitable for fiber drawing of about 200 to about 1000 poise over a reasonably wide temperature range. In addition, the glass composition should have a suitable fiber drawing viscosity in the temperature range at which the selected superconducting material is completely molten. Typically, high temperature superconductors are completely molten in a temperature range of about 1000° to about 1300° C. and preferably about 1100° to about 1200° C. Thus, the glass composition should have a viscosity of about 200 to about 1000 poise at a temperature of from about 1000° to about 1300° C. and preferably at about 1100° to about 1200° C.

Preferably, glass composition 18 is an alkali-boron-silicate glass composition. More preferably, the glass composition 18 comprises from about 70 to about 80% silicate, from about 15 to about 25% boron and from about 0% to about 10% alkali. In addition, alkali-boron-silicate glass compositions phase separate after annealing at relatively low temperatures of about 500° C. This phase separation provides an alkali-boron rich phase which can be easily removed by leaching and an inert strong silicate phase which is resistant to leaching. A microporous outer cladding layer is then provided with the micropores being formed by the removal of the alkali-boron phase of the glass. A microporous outer cladding layer can be important for various superconducting materials and will be described in greater detail below. Glass composition 18 can also be prepared from readily available raw materials. One example of a suitable glass composition 18 for the present invention comprises 75 weight % $SiO_2$, 20 weight % $B_2O_3$ and 5 weight % $Na_2O$.

The raw materials forming the superconducting composition 16 and the glass composition 18 are melted in a double-bushing 20. Double-bushing 20 comprises a first crucible 22 located within a second crucible 24. Molten superconducting composition 16 is held in first crucible 22 while molten glass composition 18 is held within second crucible 24. To form a fiber or wire, molten superconducting material 16 is drawn from first crucible 22 through bushing tip 26. Simultaneously, molten glass composition 18 is drawn from second crucible 24 through bushing tip 26. Wire preform 25 is thereby formed having a superconducting core 12 and a glass cladding layer 14. The molten compositions then cool to form wire preform 25.

Wire preform 25 may have a fiber diameter in the range of about 10 to about 200 μm. The small diameter allows wire preform 25 to cool at a very high rate of about 100,000° C./sec. The fast cooling rate of wire preform 25 minimizes interaction between superconducting composition 16 and the glass composition 18. This assures the stoichiometric composition of superconducting core 12 remains in the proper ranges. In addition, the high cooling rate prevents the crystallization and growth of non-superconducting phases in the superconducting core 12 which can be present with slower cooling rates. Non-superconducting phases must be remelted and/or reacted in order to be converted to a superconducting state. Thus, the elimination of non-superconducting phases allows essentially all of the superconducting composition 16 to be converted to the superconducting phase. Further, the elimination of non-superconducting phases may eliminate the need to include lead into BISSCO superconducting systems.

Figure 3:
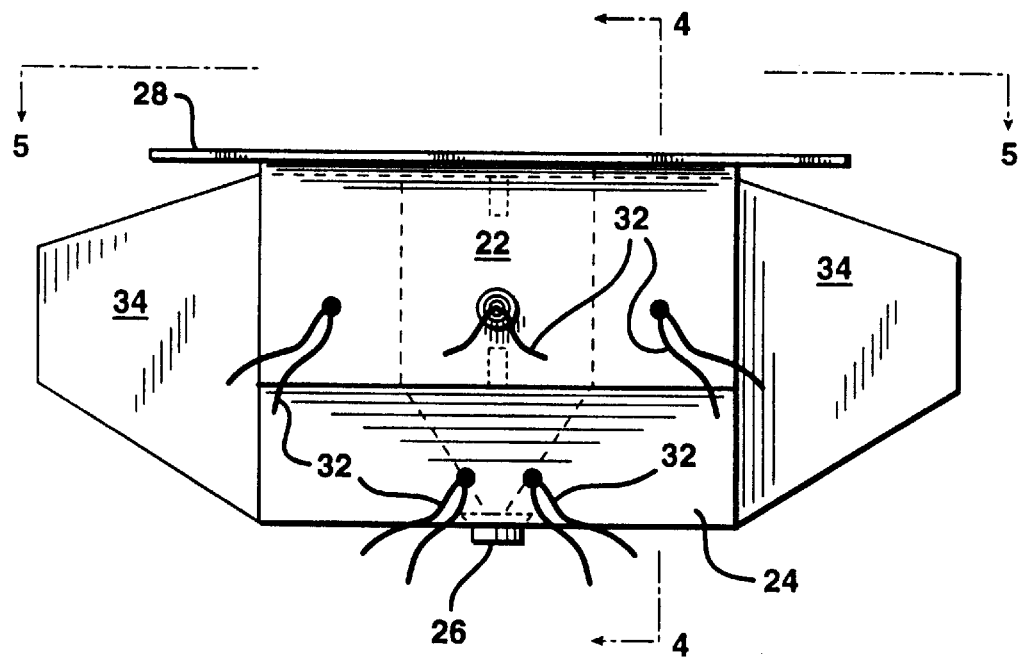
FIG. 3 is a front view of a double-bushing suitable for use in the process of FIG. 2.
Figure 5:
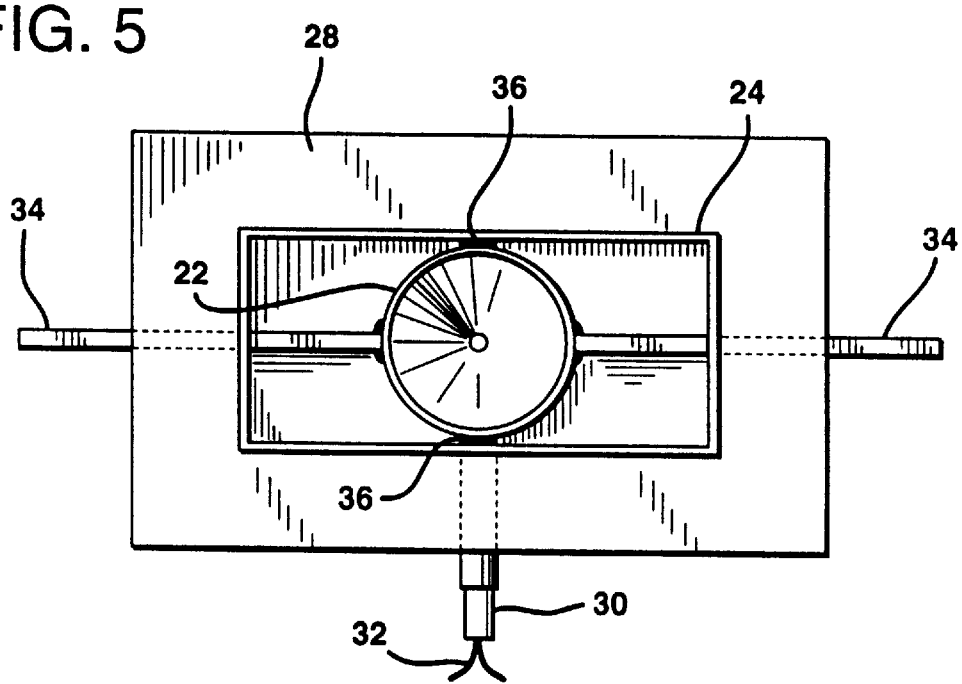
FIG. 5 is a top view of the double-bushing of FIG. 3.
Figure 4:
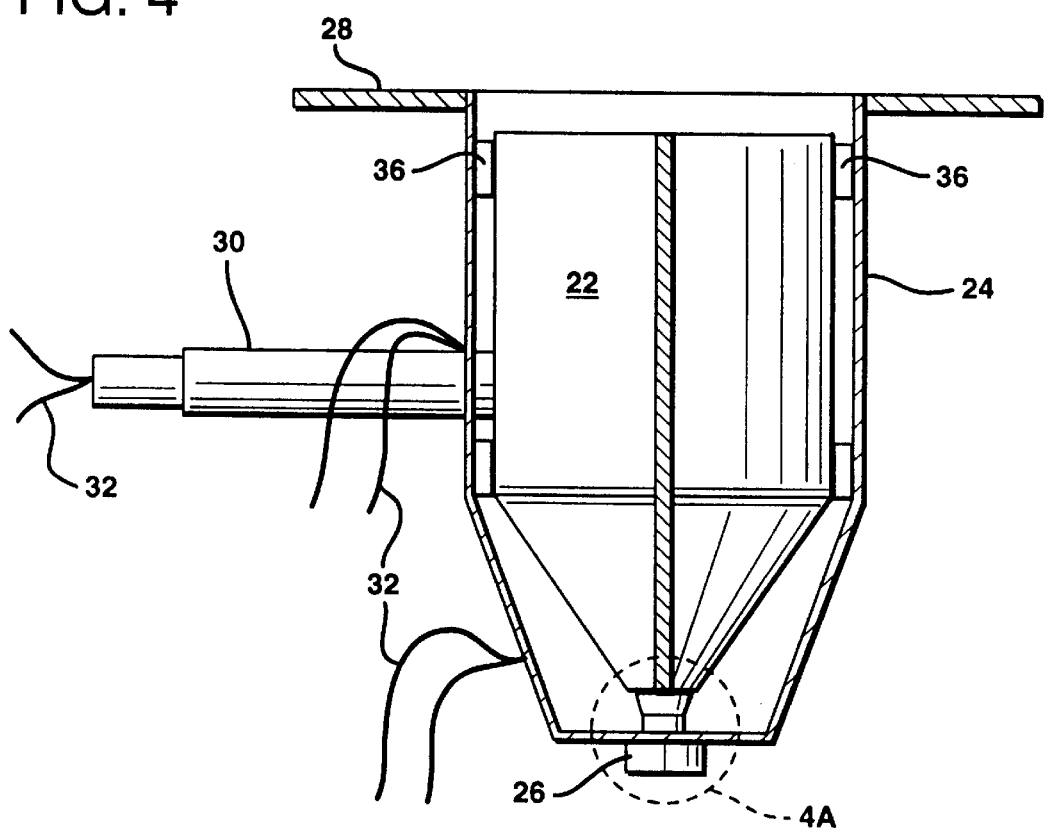
FIG. 4 is a side view of the double-bushing of FIG. 3.

Turning to FIGS. 3–5, double-bushing 20 is shown in greater detail. Double-bushing 20 comprises first crucible 22, second crucible 24 and bushing tip 26. Double-bushing 20 also includes rim plate 28 surrounding the perimeter of second crucible 24, ceramic tube 30 for passing through second crucible 24 and attaching to first crucible 22, thermocouple wires 32 for measuring the temperature of the first and second crucibles, 22 and 24, in various locations, and heating plates 34 for heating the first and second crucibles, 22 and 24. Double-bushing 20 also includes tack welds 36 to secure first crucible 22 to second crucible 24.

Figure 4A:
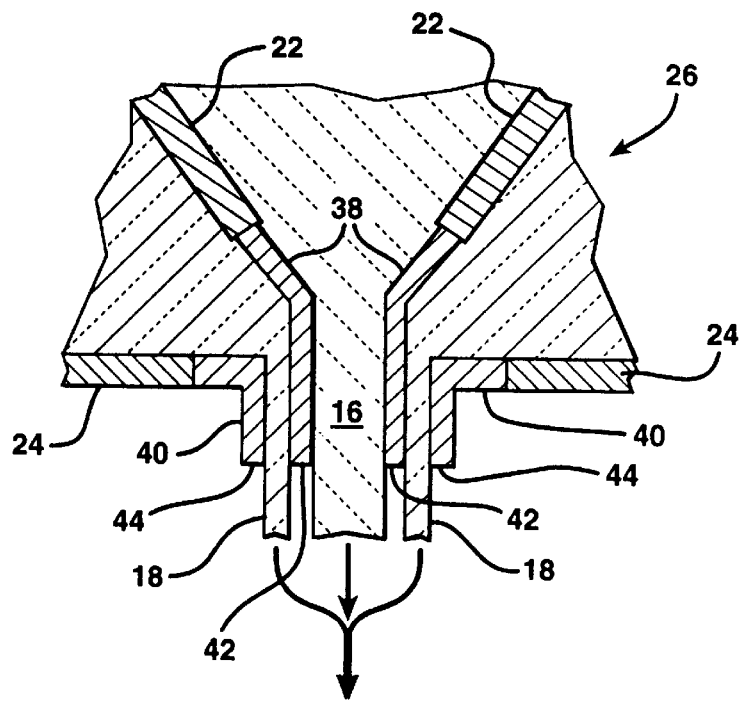
FIG. 4A is a cross-sectional side view of the tip on the double-bushing of FIG. 3.

Referring to FIG. 4A, bushing tip 26 is depicted in more detail. Bushing tip 26 includes a first tip portion 38 connected to first crucible 22 and a second tip portion 40 connected to second crucible 24. First tip portion 38 includes a first tip end opening 42 from which molten superconducting composition 16 is drawn. Likewise, second tip portion 40 includes a second tip end opening 44 from which molten glass composition 18 is drawn. Preferably, first end opening 42 and second end opening 44 are aligned so that they terminate in the same plane. However, first end opening 42 may extend beyond second end opening 44. Alternatively, second end opening 44 may extend beyond first end opening 42.

Returning to FIG. 2, wire preform 25 is drawn from bushing tip 26 through tension applied from winder 46. Winder 46 may comprise any standard winding device well-known in the art of glass fiber formation. Winder 46 winds preform 25 around a winding drum or spool to form a wound package 48. During winding, tension is applied to preform 25 to draw preform 25 from bushing tip 26. Such winders generally comprise a winding drum rotated by a variable speed motor. The speed of the winder and, thus, the speed at which preform 25 is drawn from bushing tip 26, is adjusted by varying the speed at which the motor rotates the winding drum. The winder 46 may be a standard textile winder commercially available from a number of sources. One example of a suitable winding device is a model number 966 winder available from Leesona Textile machinery of Burlington, N.C.

An optional polymeric or sizing composition may be applied at an applicator station 50 to the wire preform 25 before preform 25 is passed to winder 46. The size composition may be applied via conventional size application technology such as by spraying, electrostatic attraction or various other application methods such as roll application commonly used in commercial silicate fiber manufacturing. The size composition may comprise conventional sizing compositions which are commercially available from a number of suppliers. Conventional sizing compositions which may be employed in the present invention include those having lubricants, film forming agents, anti-static agents and various other property imparting components. Coupling agents typical in most size compositions to bind coated fibers to a polymer matrix can also be included. However, in the present invention coupling agents are not required, because the fiber is not used in a resin matrix composite where a good interface is required.

Figure 6:
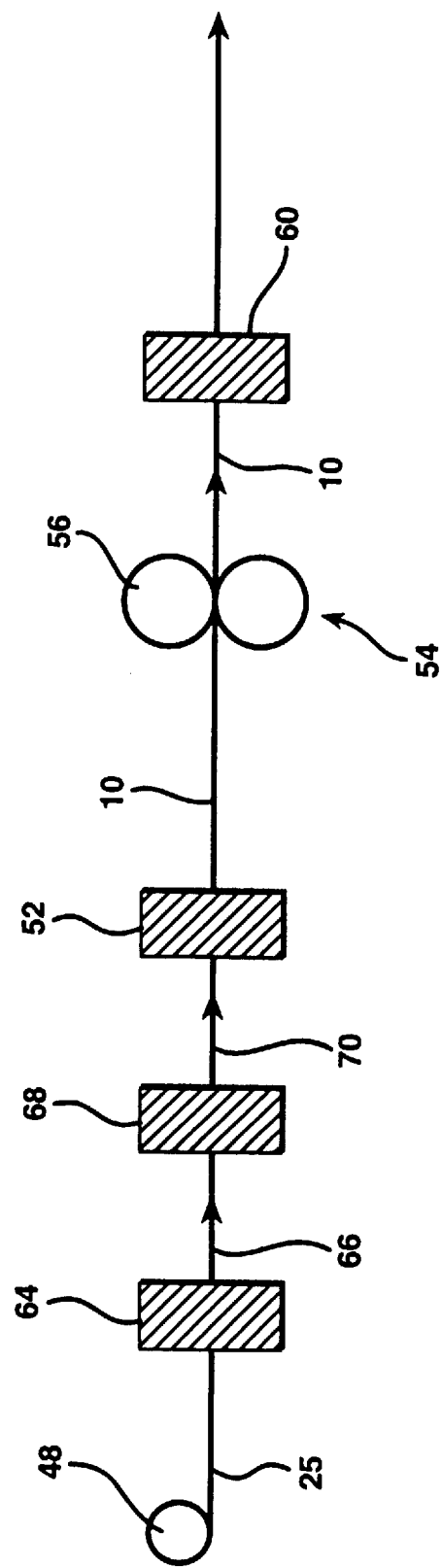
FIG. 6 is a schematic representation of the process of converting the wire preform of FIG. 2 to the superconducting wire of the present invention.

Turning now to FIG. 6, the steps of crystallizing superconducting composition 16 to convert wire preform 25 to superconducting wire 10 are shown schematically. While the process of the present invention may be a continuous process, the process will be described as a two-step process wherein wire preform 25 is wound in winder 46 after formation of preform 25 and subsequently supplied to the crystallization steps. Of course, one of ordinary skill in the art will recognize that the process of the present invention can be conducted as a continuous process with wire preform 25 being directly conveyed to the crystallization steps.

Referring to FIG. 6, wire preform 25 is supplied via wound package 48 to an annealing stage 52. After formation of wire preform 25, superconducting composition 16 is in an amorphous state and does not yet possess superconducting properties. To convert the amorphous state to a crystalline state capable of superconducting properties, preform 25 must be annealed or heated at high temperatures. The small diameter of wire preform 25 allows uniform heat distribution throughout the superconducting composition 16 and allows essentially complete crystallization of superconducting composition 16. In addition, the high rate of cooling due to the small fiber diameter prevents decomposition of the crystalline phase during the cooling process that is sometimes present with slow cooling rates.

Annealing stage 52 comprises heating wire preform 25 to a temperature in the range of about 700° to about 950° C. depending on the superconducting materials system to convert superconducting composition 16 of wire preform 25 to the crystalline superconducting state. Heating during annealing stage 52 may be accomplished via conventional heating technology in glass fiber formation such as gas forced air ovens or furnaces.

Preferably, the superconducting wire 10 of the present invention possesses a high current carrying capacity. To achieve a high current carrying capacity, it is preferable to have the Cu—O bonds, i.e. the superconducting a-b planes, aligned to be parallel to the current carrying direction, i.e. along the longitudinal axis of the fiber. This alignment of the superconducting planes along the fiber axis is achieved in the present invention during the fiber formation process. The fiber axis corresponds to the direction of the drawing direction of the fiber from bushing tip 26. Stress is applied to preform 25 in the drawing direction or fiber axis during drawing from bushing tip 26 in order to draw or pull the developing preform 25 from bushing tip 26. This stress naturally aligns the superconducting planes along the drawing direction or fiber axis.

To help assure that the superconducting planes are aligned along the fiber axis, superconducting wire 10 may be passed through a compression stage 54. Compression stage 54 applies pressure to wire 10 while wire 10 is still hot from annealing stage 52. The pressure applied to the wire helps to further align the superconducting planes along the fiber axis. Compression stage 54 may comprise any known compression device as well known in the art. Preferably, compression stage 54 comprises passing wire 10 through a pair of rollers or drums 56 to apply pressure to wire 10. Pressure ranging from a few pounds to several hundreds of pounds may be applied to wire 10.

Some superconducting materials, such as the YBCO system require the presence of oxygen during the annealing stage 52 in order to convert the superconducting material 16 from the amorphous state to the superconducting crystalline state. Thus, $O_2$ gas or an oxygen rich gas must be brought into contact with the superconducting material 16 during the annealing phase when a superconducting composition requiring oxygen is employed in the present invention.

When employing a superconducting material requiring the presence of oxygen during the annealing stage 52, the glass composition is preferably a glass composition which is capable of phase separation. Phase separation involves converting the glass composition to an inert phase and a chemically active phase. The chemically active phase may then be removed by chemical treatment leaving behind the inert phase. This treatment creates a microporous glass cladding layer. Turning to FIG. 1, a number of holes or pores 62 which extend through glass cladding layer 14 are depicted. The pores 62 in glass cladding layer 14 allow oxygen required in annealing stage 52 for specific superconducting systems to diffuse through the cladding layer 14 and come into contact with superconducting composition 16.

Returning now to FIG. 6, when oxygen is required in annealing stage 52, such as for the YBCO system, preform 25 is passed to a heat treatment stage 64. Heat treatment stage 64 heats glass preform 25 to a temperature of from about 400° to about 650° C., and preferably about 500° C. Heat treatment stage 64 causes the desired phase separation in the glass cladding layer to form a phase separated preform 66. In the case of the preferred alkali-boron-silicate glasses as glass composition 18, the glass cladding layer 14 separates into a chemically active boron rich phase and an inert silica rich phase.

To remove the chemically active phase and create a microporous glass cladding having pores 62, phase separated preform 66 is passed to a chemical treatment stage 68 thereby producing a preform 70 which is porous to oxygen gas. Chemical treatment stage 68 removes the chemically active phase from phase separated preform 66. Preferably, chemical treatment stage 68 is a leaching step wherein the chemically active phase is leached from the phase separated preform 66. The preferred leaching step is an acid leach wherein the phase separated preform 66 is placed in or passed through a bath of an acidic solution. However, various other leaching techniques such as plasma leaching may also be employed.

The acidic solution may be most any acidic solution but is preferably a mineral acid solution and most preferably a solution of hydrochloric acid. The length of time required to remove the chemically active phase in chemical treatment stage 68 will vary depending upon the concentration of the acid, temperature of the acid, and the chemically active species being removed. Preferably, a dilute solution of about 0.1 to about 5 weight % of hydrochloric acid is employed at a temperature of about 100° C. for a period of time ranging from minutes to hours depending on the thickness of cladding layer 14.

To provide strength and support to wire 10 as well as protect glass cladding layer 14, a coating 58 (shown in FIG. 1) may be applied to glass cladding layer 14. Coating 58 should be applied after annealing so that oxygen can reach the superconducting core 12 if required. Coating 58 can prevent microcracking in the glass cladding layer as well as prevent moisture degradation. Coating 58 may be any suitable coating for protecting the glass cladding outer layer 14 such as for example a polymer coating or a metallic coating. Preferably, coating 58 is a metallic coating. If glass cladding layer 14 is treated to create a microporous cladding layer having pores 62, coating 58 will penetrate the pores 62 in the glass cladding outer layer 14. Therefore, if coating 58 is metallic, coating 58 can act as a shunt of the wire 10. In other words, should the superconducting core 12 of wire 10 become damaged to create a break or gap in current flow through the wire 10, metallic coating 58 creates a means for current to bypass the gap or break thereby allowing wire 10 to continue to carry current.

The preferred metallic coating 58 may be any suitable low melting metal and is preferably a metal having good conducting capabilities. Suitable metals useful as metal coating include aluminum and indium both of which are molten at less than about 600° C. Of course, one of ordinary skill in the art will recognize that various other low melting, conductive metals may also be employed. Metallic coating 58 may be applied to wire 10 at a coating station 60 via conventional means such as a sputtering technique or preferably by passing the wire through a bath of molten metal.

Thus, the present invention provides a superconducting fiber or wire 10 having a high level of flexibility due to its small diameter of preferably from about 10 to about 200 μm. Accordingly, the superconducting wire of the present invention can easily be wrapped around small cylinders to form coils for motors. In addition, the superconducting wire of the present invention has a high current carrying capacity of at least about $10^4$ amps/sq.cm., an expected core density of about 100%, (i.e., no pores in the core), and a high level of mechanical strength.

The present invention provides a superconducting fiber or wire 10 which can be formed to most any length. The superconducting wire 10 may be formed to lengths greater than possible in prior art processes. The superconducting wire 10 can be formed to lengths of at least about 1 kilometer (km), more preferably at least about to 5 kilometers (km) and even greater than about 10 kilometers (km). In addition, the wire or fiber 10 may have a substantially circular cross-section at these lengths.

Having described the invention in detail and by reference to the preferred embodiment thereof, it will be apparent that modifications and variations are possible without departing from the scope of the invention which is defined in the appended claims.

I claim:

1. A process for making a superconducting fiber or wire having a glass cladding layer comprising the steps of:
   a) melting a metal or ceramic superconducting composition in first crucible;
   b) melting a glass composition in a second crucible,
   c) forming a preform by simultaneously drawing the molten metal or ceramic superconducting composition through an orifice while drawing the molten glass composition as a cladding layer surrounding said superconducting composition;
   d) annealing the preform to crystallize a superconducting phase in said superconducting composition to form the superconducting fiber or wire; and
   e) cooling the superconducting wire or fiber.

2. The process as claimed in claim 1 including the step of coating the glass cladding layer of the preform with a polymer or sizing composition.

3. The process as claimed in claim 1 including the step of heat treating the preform, prior to said step of annealing, to promote phase separation of said glass cladding layer and then removing one of said separated phases of said glass.

4. The process as claimed in claim 3 wherein said step of heat treating the preform comprises heating said preform to a temperature of from about 400° to about 650° C.

5. The process as claimed in claim 3 wherein said step of removing one of said separated phases includes chemically etching said glass cladding layer.

6. The process as claimed in claim 1 wherein said step of annealing the preform comprises heating said preform to a temperature of from about 700° to about 950° C.

7. The process as claimed in claim 6 wherein the step of annealing said preform further includes the step of compressing the heated preform.

8. The process as claimed in claim 3 wherein said step of annealing further includes the step of bringing an oxygen containing gas into contact with said superconducting composition.

9. The process as claimed in claim 1 including the step of coating a metal over said cladding layer of said superconducting wire or fiber.

10. The process as claimed in claim 1 wherein said process is continuous.

11. The process as claimed in claim 1 in which said superconducting composition is a Bi—Sr—Ca—Cu—O ceramic.

12. The process as claimed in claim 1 wherein said superconducting composition is a Y—Ba—Ca—Cu—O ceramic.

13. The process as claimed in claim 1 wherein said superconducting composition is a Tl—Ba—Ca—Cu—O ceramic.

14. The process as claimed in claim 1 wherein said superconducting composition is a Hg—Ba—Ca—Cu—O ceramic.

15. The process as claimed in claim 1 wherein said glass composition is an alkali-boron-silicate glass.

16. A process for making a superconducting fiber or wire having a glass cladding layer comprising the steps of:
   a) melting a metal or ceramic superconducting composition in a first crucible;

b) melting a glass composition in a second crucible;

c) forming a preform by simultaneously drawing the molten metal or ceramic superconducting composition through an orifice while drawing the molten glass composition as a cladding layer surrounding said superconducting composition;

d) heat treating the preform to promote phase separation of said glass cladding layer into at least two phases;

e) removing one of said separated phases of said glass cladding layer to form a microporous preform;

f) annealing the microporous preform to crystallize a superconducting phase in said superconducting composition and form the superconducting fiber or wire; and g) cooling the superconducting fiber or wire.

17. The process as claimed in claim 16 wherein said superconducting composition is a Y—Ba—Cu—O ceramic.

18. The process as claimed in claim 16 wherein said step of annealing further includes the step of bringing an oxygen contained gas into contact with said superconducting composition.

19. The process as claimed in claim 16 wherein said glass composition is an alkali-boron-silicate glass.

20. The process as claimed in claim 16 wherein said step of removing one of said separated phases includes chemically etching said glass cladding layer.

* * * * *